United States Patent [19]

Stager et al.

[11] Patent Number: 5,777,383
[45] Date of Patent: Jul. 7, 1998

[54] SEMICONDUCTOR CHIP PACKAGE WITH INTERCONNECT LAYERS AND ROUTING AND TESTING METHODS

[75] Inventors: Mark P. Stager, Santa Clara; Abraham F. Yee, Cupertino; Gobi R. Padmanabhan, Sunnyvale, all of Calif.

[73] Assignee: LSI Logic Corporation, Milpitas, Calif.

[21] Appl. No.: 647,344

[22] Filed: May 9, 1996

[51] Int. Cl.$^6$ .................. H01L 23/53; H01L 23/12; H01L 25/10
[52] U.S. Cl. .................. 257/700; 257/697; 257/206; 257/211; 257/738; 257/698; 257/693
[58] Field of Search .................. 257/700, 697, 257/698, 691, 693, 703, 737, 738, 206, 211

[56] References Cited

U.S. PATENT DOCUMENTS

| | | | |
|---|---|---|---|
| 3,603,771 | 9/1971 | Isett et al. | 235/151 |
| 3,629,843 | 12/1971 | Scheinman | 340/172.5 |
| 3,644,937 | 2/1972 | Isett | 444/1 |
| 3,702,004 | 10/1972 | Eskew et al. | 444/1 |
| 4,193,082 | 3/1980 | Dougherty | 257/700 |
| 4,407,007 | 9/1983 | Desai et al. | 257/700 |
| 4,613,941 | 9/1986 | Smith et al. | 364/490 |
| 4,743,954 | 5/1988 | Brown | 257/253 |
| 4,777,606 | 10/1988 | Fournier | 364/491 |
| 4,835,705 | 5/1989 | Fujino et al. | 364/491 |
| 4,852,015 | 7/1989 | Doyle, Jr. | 364/491 |
| 4,855,929 | 8/1989 | Nakajima | 364/490 |
| 4,890,238 | 12/1989 | Klein et al. | 364/491 |
| 4,918,614 | 4/1990 | Modarres et al. | 364/490 |
| 4,972,253 | 11/1990 | Palino et al. | 257/700 |
| 5,046,017 | 9/1991 | Yuyama et al. | 364/491 |
| 5,239,465 | 8/1993 | Hattori et al. | 364/419.19 |
| 5,367,187 | 11/1994 | Yuen | 257/206 |
| 5,376,390 | 12/1994 | Mohsen | 257/211 |
| 5,383,787 | 1/1995 | Switky et al. | 439/67 |
| 5,413,489 | 5/1995 | Switky | 439/71 |
| 5,444,298 | 8/1995 | Schutz | 257/724 |
| 5,481,435 | 1/1996 | Werther | 257/697 |
| 5,629,838 | 5/1997 | Knight et al. | 361/782 |
| 5,654,127 | 8/1997 | Leedy | 430/315 |

FOREIGN PATENT DOCUMENTS

| | | | |
|---|---|---|---|
| 379404 A | 7/1990 | European Pat. Off. | 257/700 |
| 414204 A | 2/1991 | European Pat. Off. | 257/700 |

(List continued on next page.)

OTHER PUBLICATIONS

IBM Technical Disclosure Bulletin vol. 34, No. 11 pp. 395–396, Apr. 1992.

Primary Examiner—Tom Thomas
Assistant Examiner—Alexander Oscar Williams
Attorney, Agent, or Firm—D'Alessandro & Ritchie

[57] ABSTRACT

A package for a semiconductor chip is provided which incorporates a plurality of levels of interconnect—conductive layers within the package which selectively direct signals to and from pins of the die and/or the pins of the package. A single general purpose chip may thus be fabricated in large quantities with the interconnect of the package used to define the specific purpose, functionality and pinout of the final device. Similarly, a standard package may be built to work with a large class of different chips and only the interconnect layers in the package need to be modified to allow the package to work with each different chip. In a second aspect of the invention, one or more layers of interconnect in the package may contain active electronic components which may be connected to nodes of the chip through the interconnect of the package and through the pins of the die. Accordingly, devices which are difficult or impossible to incorporate into a semiconductor die may be incorporated into a single package along with the die. In a third aspect of the invention, a method of integrated circuit design includes using a conventional CAD design tool software package to design not only the integrated circuit, but also variable circuit elements (such as interconnect and electronic components) embedded in the chip package. In a fourth aspect of the invention, a testing methodology for wafer die subcomponents is provided.

10 Claims, 4 Drawing Sheets

FOREIGN PATENT DOCUMENTS

| | | | |
|---|---|---|---|
| 602338 A1 | 6/1994 | European Pat. Off. | 257/700 |
| 57-106062 | 7/1982 | Japan | 257/700 |
| 6-53349 | 2/1994 | Japan | 257/700 |
| 6-151430 | 5/1994 | Japan | 257/700 |
| 6-151633 | 5/1994 | Japan | 257/700 |
| 6-163807 | 6/1994 | Japan | 257/700 |

SEMICONDUCTOR CHIP PACKAGE WITH INTERCONNECT LAYERS AND ROUTING AND TESTING METHODS

BACKGROUND OF THE INVENTION

1. Field of the Invention

This invention relates to a method and apparatus for packaging a semiconductor chip. More particularly, this invention is directed to chip packaging which incorporates plural interconnect layers and/or active electrical components which may be connected directly to the semiconductor chip. In this way, the package may serve as additional interconnect routing signals from the chip to the package level interconnect and then back to the chip, as desired, and may be used to determine the precise functionality of a more general purpose chip which is configurable by means of shorting straps contained in the package. Moreover, the chip and package may be designed together as one hybrid device allowing conventional CAD design tools for semiconductor circuit layout to take advantage of additional interconnect and circuit components available in the package itself.

2. The Prior Art

Semiconductor chip packages typically serve the purpose of encapsulating a semiconductor chip die and providing an electrical interface to a larger board level circuit component, such as a socket or pads on a printed circuit board. As such, the package must provide both a first plurality of electrical connections to the semiconductor die and a second plurality of electrical connections adapted for connection to the board level circuit component.

A most common form of providing the die to package connections is through wire bonding. In wire bonding, the die is secured to the package, sometimes with an adhesive, and pads on the die are connected to pads on the package with wire. The pads on the package are, in turn, connected to pins, bumps, or other electrical interface connectors on the package which are adapted to be electrically connected to mating connectors on a printed circuit board.

Another well known technique is known as "flip-chip", "C4" or "ball grid array" technology which is used as a means of building low cost, high performance, high input/output density assemblies. In these types of assemblies, metal bumps, studs, or balls of metals (collectively referred to herein as "bump-type" interconnections) are usually applied in a two dimensional array pattern, either directly to the active surface of a semiconductor chip, or alternatively, to an intermediate substrate carrier of the semiconductor. The assembly is made by flipping the active, bumped surface over and then aligning the bumps of the chip with corresponding pads on a substrate to which the electrical connection is to be made. The substrate may be either a part of a semiconductor package (such as a multi-chip module, ceramic chip carrier, or the like), or a board level assembly. The metal bumps are commonly fabricated of a solder composition that can be mass reflowed in an oven, at which point all of the contacts of all of the bumps are soldered simultaneously (see, for example, U.S. Pat. No. 5,075,965 to Carrey et al., entitled "Low Temperature Controlled Collapse Chip Attach Process" which generally describes the "flip-chip", "C4" or "ball grid array" technology).

In another variant of the flip-chip method, metal studs or "stud bumps" are attached to the chip by a wire-bond method, and the assembly is made by application of an electrically conductive adhesive material, which is subsequently cured en masse in an oven. There is also a flip chip assembly method that uses thermo-compression as a method of joining mating gold or aluminum bumps.

In flip-chip structures, the semiconductor die is generally connected to a package substrate or "spreader" which generally functions to spread the contact array from a first density at the die to a second, lower density. Such a system is described, for example, in U.S. Pat. No. 5,413,489 to Switky. In such spreaders there is generally a one-to-one correspondence between each electrical contact of the spreader which is to contact the die and a corresponding electrical contact which is to contact the board. Thus a spreader merely acts to spread the contact density of the die to a more manageable contact density for attachment to a board.

As the cost and complexity of semiconductor chips, particularly application specific integrated circuit chips (ASICs), increases, there is a corresponding increase in the cost of designing, qualifying and fabricating packaging for these devices. Yet with each new chip, a new package must be qualified for that chip, translating contacts on the chip die to specific pin-outs on a package for the chip. This paradigm is relatively inflexible and leads to higher combined package and chip costs than might otherwise be necessary. It would be desirable to have a more flexible type of package which could, itself, impart additional flexibility and utility to the chip itself while reducing total cost.

It is now common in the semiconductor industry to design semiconductor circuits using computer aided design (CAD) software tool packages such as those available from Mentor Graphics, Cadence, Viewlogic Systems and LSI Logic. Heretofore, such packages have been used to lay out the design of integrated circuits on a semiconductor wafer, but they have not been used to design any aspect of the package. It would be desirable to construct the chip package in such a way that it incorporates variable elements which could be made available to such CAD packages in order to provide for more design flexibility and options.

SUMMARY OF THE INVENTION

In accordance with a first aspect of the present invention, a package for a semiconductor chip is provided which incorporates a plurality of levels of interconnect—conductive layers within the package which selectively direct signals to and from pins of the die and/or the pins of the package. Accordingly, a single general purpose chip could be fabricated in large quantities with the interconnect of the package used to define the specific purpose, functionality and pinout of the final device. Similarly, a standard package can be built to work with a large class of different chips and only the interconnect layers in the package need to be modified to allow the package to work with each different chip.

In accordance with a second aspect of the present invention, one or more layers of interconnect in the package may contain active electronic components, e.g., chip resistors, chip capacitors, chip diodes, and the like, which could be connected to nodes of the chip through the interconnect of the package and through the pins of the die. Accordingly, devices which are difficult or impossible to incorporate into a semiconductor die due to their size, current handling capability, voltage handling capability, or otherwise, can be incorporated into a single package along with the die.

In accordance with a third aspect of the invention, a method of integrated circuit design includes using a conventional CAD package to design not only the integrated circuit, but also variable circuit elements (such as interconnect and electronic components) embedded in the chip package to thus permit CAD design of the entire electrical structure of the combined chip and package.

In accordance with a fourth aspect of the invention, a method of testing wafer die subcomponents of the chip-package assembly is provided. According to the testing method, automated test equipment is connected to circuitry to duplicate or emulate the circuit functions provided by the package (interconnect and electrical components). In this way, the wafer die will behave as if it were connected to the package while under test.

DESCRIPTION OF THE PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

Package

Figure 1:
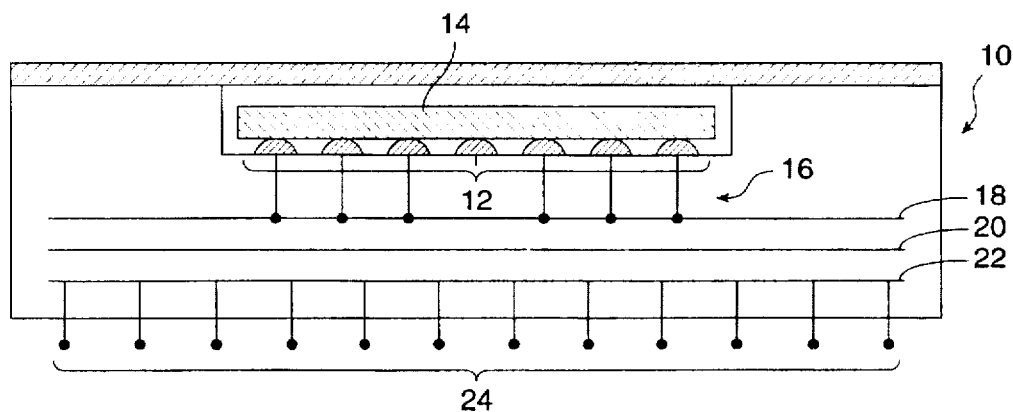
FIG. 1 is an elevational cross sectional drawing of a semiconductor die and package with three levels of package interconnect according to a presently preferred embodiment of the present invention.

The present invention relates to a new type of package for semiconductor dies. The package is useable with conventional wire bonding, flip-chip technology, and other methods of connecting the electronic I/O pads of a semiconductor die to a package. Turning to FIG. 1, a package 10 is shown. Package 10 includes a first plurality of I/O contacts 12 which are connected to a plurality of I/O pads on die 14. The diagram shows a flip-chip orientation. First connections 16 are provided to connect contacts 12 to first interconnect level 18. A second interconnect level 20 and a third interconnect level 22 are also shown. Third interconnect level 22 is connected to a plurality of package pins 24 which provide an electrical interface from the package to board level electronics such as solder pads on a printed circuit board, contact pads, a socket, or otherwise as well known to those of ordinary skill in the art.

Figure 2:
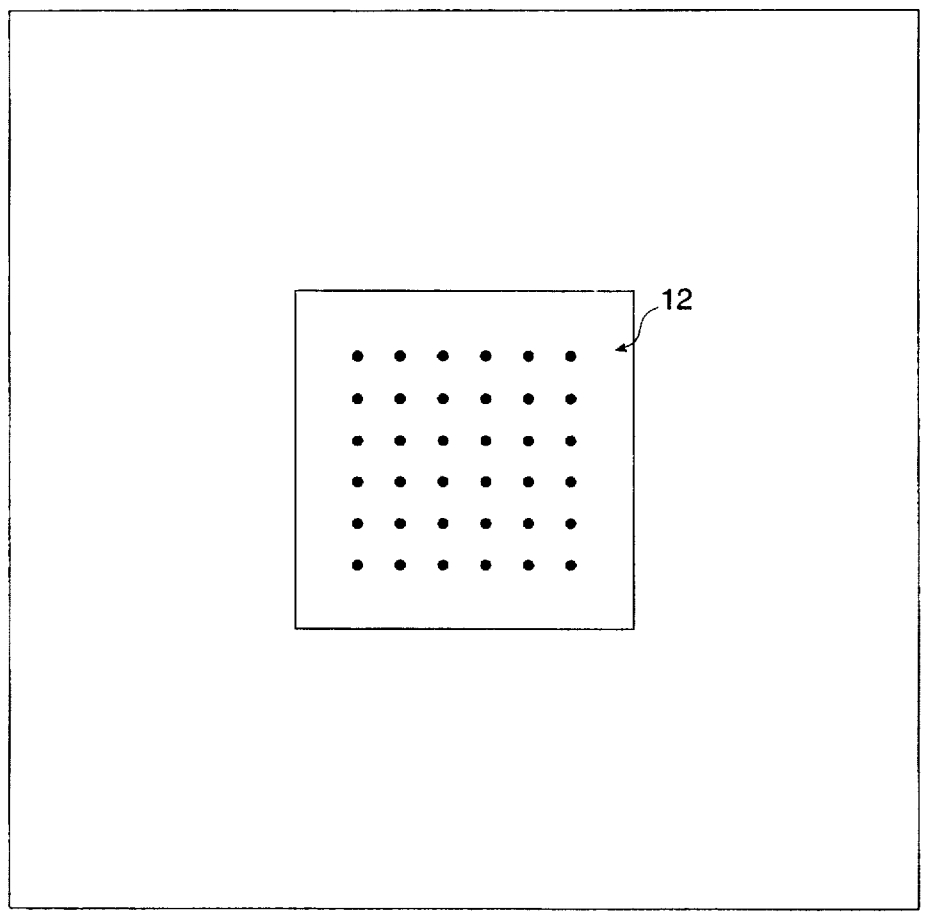
FIG. 2 is a top view of a semiconductor package according to a presently preferred embodiment of the present invention.

FIG. 2 is a top view of the package showing first I/O contacts 12 disposed in a typical flip-chip array.

Figure 3:
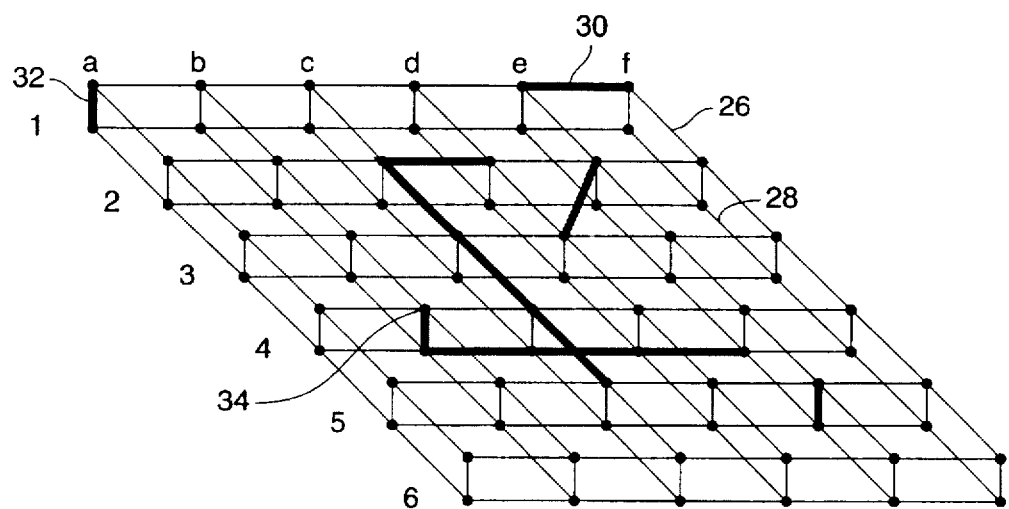
FIG. 3 is a schematic diagram of two levels of package interconnect of a semiconductor die package according to a presently preferred embodiment of the present invention.

FIG. 3 is a schematic diagram showing interconnections between a pair of interconnect levels as might be employed with package 10. In FIG. 3, a first planar interconnect level 26 is disposed above a second planar interconnect level 28. For convenience, the nodes of each interconnect level are labelled 1a–6f. In this example, we will assume that the nodes 1a–6f of first interconnect layer 26 are connected to pads to which the pads of chip 10 are or will be connected and that nodes 1a–6f of second interconnect layer 28 are connected to pins 24 of package 10. A one-to-one correspondence is not required, but is convenient in this discussion.

Several functions can be provided by package interconnect as shown in FIG. 3. First, if a chip has more than one function or configuration, that function or configuration can be selected by shorting one or more pairs of pads of die 14. For example, if die pads connected to nodes 1e and 1f of first interconnect level 26 need to be shorted in order to achieve a particular desired function, the interconnect can include a shorting strap 30 to connect these two nodes. Thus, when the chip is embedded in the package, these two pads will be shorted and the chip's functionality determined.

Second, where it is desired to connect a die pad directly to a package pin, such as by connecting node 1a of first interconnect layer 26 to node 1a of second interconnect layer, a shorting strap 32 may be implemented. Similarly, many desired interconnection arrangements may be used to set flags, determine conditions, interconnect die pads and package pins, and the like. Similarly, a die pad connected to node 4b of first interconnect layer 26 can be connected to a package pin connected to node 4e of second interconnect layer 28 as shown with strap 34.

Fabrication of the package including interconnect levels may be done in any of a number of ways. For example, the interconnect can be fabricated in much the same way as spreaders are formed using conductive traces on successive layers of nonconductive material and providing inter-layer connections with conductive vias (see, e.g., U.S. Pat. No. 5,413,489 to Switky at columns 3 and 4).

Embedded Components

Figure 4:
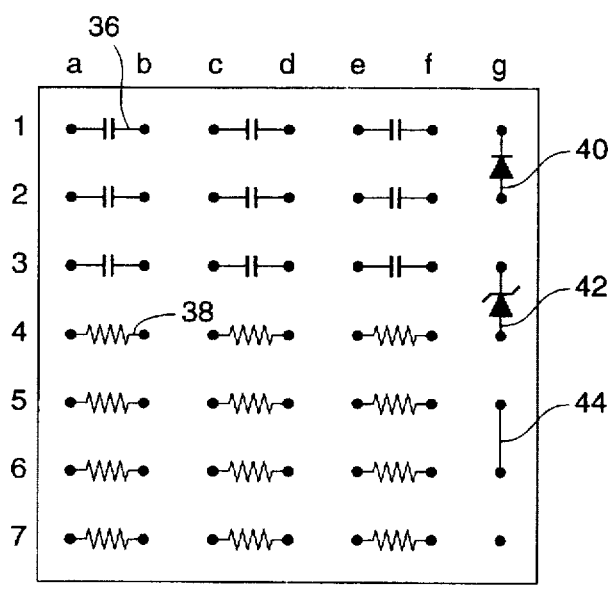
FIG. 4 is a schematic diagram of a single level of package interconnect including active electronic components according to a presently preferred embodiment of the present invention.

In another aspect of the invention, one or more active electronic components can be embedded in the package between predetermined nodes of one or more interconnect levels. FIG. 4 shows schematically an arrangement for this implementation. A capacitor 36 such as a chip capacitor may be electrically connected between node 1a and 1b of the interconnect level shown at FIG. 4. A resistor 38 such as a chip resistor may be electrically connected between node 4a and 4b. A diode 40 may be connected between nodes 2g and 1g. A zener diode 42 may be embedded between nodes 4g and 3g. Other components as desired, including high power components which cannot easily be fabricated on board chip 14 can also be included. Shorting straps 44 may also be included in a package interconnect level such as shown in FIG. 4.

Figure 5:
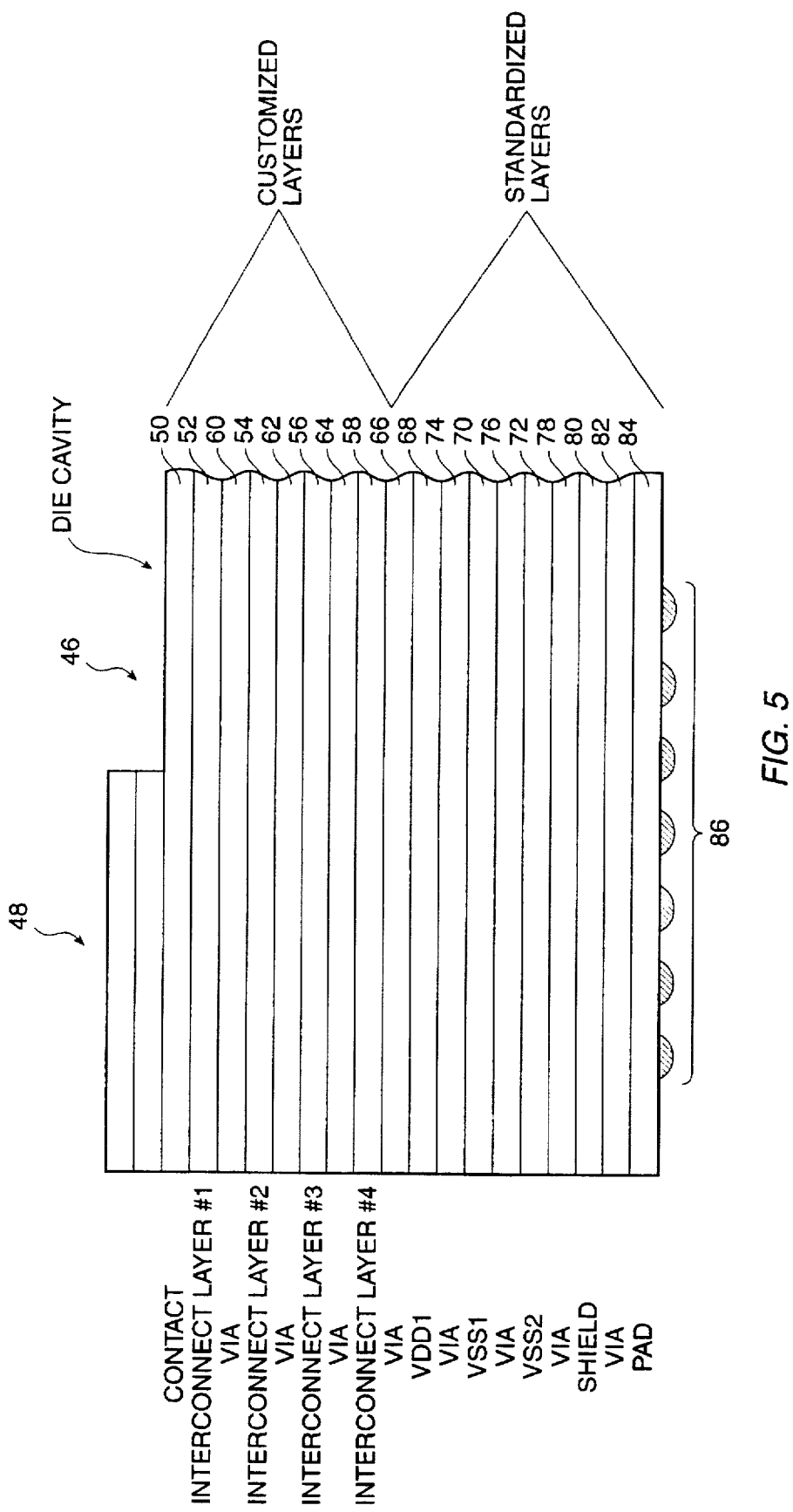
FIG. 5 is an elevational cross sectional drawing of a die package with four levels of customizable package interconnect and a number of standardized layers according to a presently preferred embodiment of the present invention.

According to a presently preferred embodiment of the present invention, an entire structure with a number of levels of customizable interconnect, standardized power distribution layers, a ground shield layer and optional component bearing layers is contemplated. Turning to FIG. 5 a die cavity 46 is provided in package 48. Beneath die cavity 46 is a contact layer 50 having contacts to which die pads are to be bonded by wire bonding, flip-chip or another process. Four interconnect layers 52, 54, 56, 58 and corresponding via layers 60, 62, 64, 66 are provided. Layers 50–66 are intended to be customizable and can be laid out with conventional CAD design software as is presently used for laying out interconnect that is physically disposed within a chip as would be apparent to those of ordinary skill in the art. Various power supply voltages are made available at power planes 68, 70 and 72 which are separated by via layers 74, 76 and 78. A shield layer 80 is preferably included and may be connected to ground. Apertures are provided where signals are to pass through shield layer 80. Another via layer 82 separates the structure set forth above from pad layer 84 to which are connected actual pads or pins 86 which are designed to interface to a board level structure. Pads or pins 86 may be any appropriate shape such as that of pads to be soldered to a printed circuit board, a flip-chip pall grid array, similarly for soldering to a board, or pins or tabs for use with a socket to which the package will be removably attached.

It should be noted that shield layers such as shield layer 80 may be incorporated as desired to achieve improved signal isolation. Thus, if desired, shield layers could be placed between any or each level of interconnect in the chip package.

Also, embedded electrical component layers as in FIG. 4 may be made variable between packages like the interconnect layers for added flexibility. Thus two packages could share much in common with only a couple of layers of interconnect and an electrical component layer being different, for example.

Design Methodology

Modern integrated circuit design depends upon computer aided design (CAD) software packages. Typical of such packages are various software tools available from Mentor Graphics of Beaverton, Oreg.; various software tools available from Cadence Design Systems of San Jose, Calif.; various software tools available from Viewlogic Systems, Inc. of Marlboro, Mass., and a software package known as "Toolkit" available from LSI Logic Corporation of Milpitas, Calif.

At present, the aforementioned CAD packages facilitate the computer aided electrical design and layout of integrated circuits—but only those portions of the circuits that are fabricated on silicon or other semiconductor wafers. They do not presently permit package design because, prior to the present invention, package elements were not considered to be practically variable elements in such design efforts.

With the added interconnect available in the above-described chip package, it is a relatively straightforward matter to modify the standard commercial CAD packages discussed above to include provisions for on-package interconnect and electrical components. With the added options, a significantly improved flexibility and routability is provided to the designer that was not previously available in the prior art. For example, routing with on-chip interconnect can become difficult in extremely complex integrated circuits due to the limited on-chip interconnect resources available. By increasing the available interconnect through incorporation of on-package interconnect, more complex routing solutions become possible that were previously not possible.

Testing

Current production semiconductor wafer dies are tested on-wafer by automatic test equipment and wafer probers as well known to those of skill in the art. Typically the way this is done is to apply signals to bonding pads of the chip and detect resultant signals that should ensue on other bonding pads. When the resultant signals are as expected for a given stimulus, the chip works and is useable. In the past, the circuit was essentially complete on board the chip and such testing was a straightforward notion. With the present invention, such testing is less straightforward because routing and components necessary for use of the circuit may be intended to be in the package and not part of the chip.

In accordance with another aspect of the present invention, a method for testing the completed, but unpackaged wafer die involves associating with the automatic test equipment the same routing and electrical components as would be present in the die package. Thus, if the die package connects pin 1 and pin 2 of the chip, the probes for testing the wafer die will be connected accordingly so that under test the chip behaves as if it were in the package. Similarly, electrical components, known to work, would be associated with the corresponding testing probes of the test equipment to achieve the same net electrical effect. Since the test equipment "die package" would be known to be good, any die failing the test would be bad due to damage to the chip. In this way, chips could be tested on-wafer before assembly into full packaged components, thus saving the cost of assembling bad chips into full packaged components.

Figure 6:
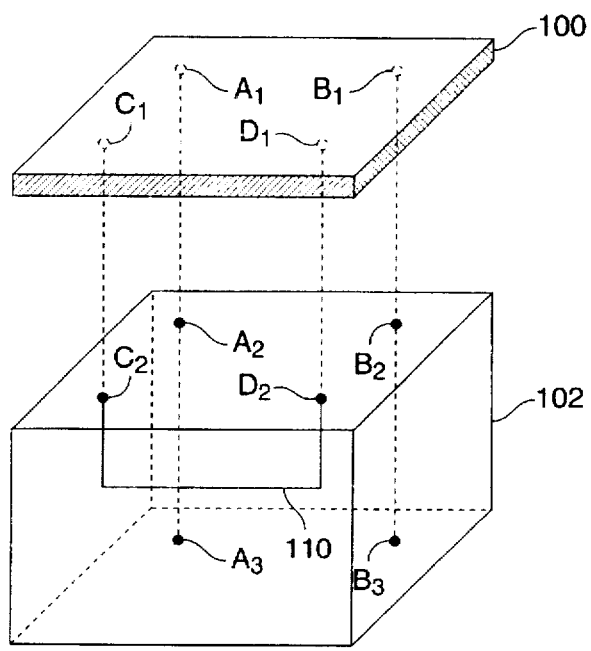
FIG. 6 schematically shows a wafer die and package.
Figure 7:
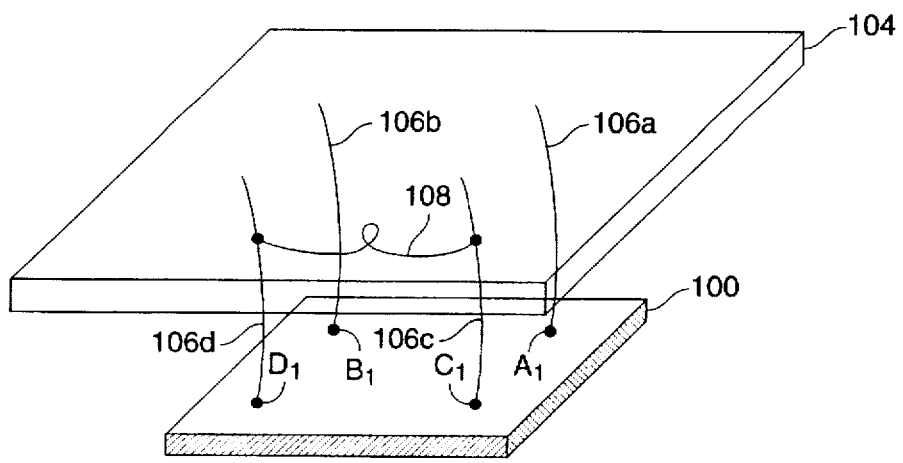
FIG. 7 schematically shows a probe card of automatic test equipment disposed over and in contact with a wafer die for testing.

An example of the test methodology is depicted in FIGS. 6 and 7. FIG. 6 schematically shows a wafer die and package. FIG. 7 schematically shows a probe card of automatic test equipment disposed over and in contact with a wafer die for testing. Die 100 has 4 I/O pins A1, B1, C1 and D1. Package 102 has four corresponding I/O connections A2, B2, C2, D2. Package 102 has interconnect 110 which shorts pins C2 and D2; it also has board level I/O pins A3 and B3, all connected as shown. To test die 100 in the absence of the package 102, a test card 104 having probes 106a, 106b, 106c and 106d is disposed over die 100 and probes 106a–d are made to contact corresponding pins A1, B1, C1 and D1. Because C1 and D1 are supposed to be shorted, in order to obtain test conditions similar to the real electrical configuration in which the die is to be used, probes 106c and 106d are connected together by shorting strap 108 as shown. In this way, the die is tested in the absence of the package while still uncut on the semiconductor wafer.

Alternative Embodiments

Although illustrative presently preferred embodiments and applications of this invention are shown and described herein, many variations and modifications are possible which remain within the concept, scope, and spirit of the invention, and these variations would become clear to those of skill in the art after perusal of this application. The invention, therefore, is not to be limited except in the spirit of the appended claims.

What is claimed is:

1. A package for a semiconductor chip, said package comprising:

a first layer having a first surface including a first level and a second level, said second level defining a chip receptacle area, said chip receptacle area located on said top surface;

a plurality of conductive chip interface terminals disposed within said chip receptacle;

a board interface including an array of a plurality of conductive board interface terminals, said array located on a second surface of the package, said second surface opposite from said first surface; and a plurality of interconnect layers disposed with the package, said layers including electrical connections to said chip interface terminals and electrical connections to said board interface terminals, wherein at least one of said interconnect layers within said plurality of interconnect layers contains an active component selected from the group consisting of diodes, zener diodes, transistors, FET's MOSFET's, LED's, and voltage regulators.

2. A method for designing an assembly formed FROM an integrated circuit wafer die and a package for the die, the package containing a plurality of interconnect layers, the method comprising the steps of:

using a CAD design tool to design the electrical layout of the assembly;

making the CAD design tool aware of the interconnect layers disposed within the die package;

making the CAD design tool aware of a board interface including an array of a plurality of conductive board interface terminals, said array located on a second surface of the package, said second surface opposite from said first surface:

having the CAD design tool prepare a design for the assembly including at least one electrical routing from the wafer die to the interconnect and back to the wafer die; and having the CAD design tool prepare a design for the assembly including at least one electrical routing from one of the interconnect layers to one of said conductive board interface terminals.

3. A method for designing an assembly including an integrated circuit wafer die and a die package, the die package including an electrical component, the method comprising the steps of:

using a CAD design tool to design the electrical layout of the assembly;

making the CAD design tool aware of the electrical component disposed within the die package;

making the CAD design tool aware of a board interface including an array of a plurality of conductive board interface terminals, said array located on a second surface of the package, said second surface opposite from said first surface;

having the CAD design tool prepare a design for the assembly including at least one electrical routing from the wafer die to the electrical component and back to the wafer die and having the CAD design tool prepare a design for the assembly including at least one electrical routine from one of the interconnect layers to one of said conductive board interface terminals.

4. A method for designing an assembly formed from an integrated circuit wafer die and a die package for encapsulating the die, the die package containing a plurality of interconnect layers and an electrical component, the method comprising the steps of:

using a CAD design tool to design an electrical layout of the assembly;

making the CAD design tool aware of the interconnect layers disposed within the die package;

making the CAD design tool aware of the electrical component disposed within the die package;

making the CAD design tool aware of a board interface including an array of a plurality of conductive board interface terminals, said array located on a second surface of the package, said second surface opposite from said first surface;

having the CAD design tool prepare a design for the assembly including: at least one electrical routing from the wafer die to the interconnect and back to the wafer die, and at least one electrical routing from the wafer die to the electrical component and back to the wafer die; and having the CAD design tool prepare a design for the assembly including at least one electrical routing from one of the interconnect layers to one of said conductive board interface terminals.

5. A method for testing an uncut semiconductor wafer die disposed on a semiconductor wafer, the uncut die intended to be assembled to a package including at least a plurality of levels of interconnect, the method comprising the steps of:

using a plurality of probes to interface a plurality of electrical signals to and from the die;

interconnecting the probes together through probe interconnections to emulate the electrical function of the levels of interconnect that would be present if the die were mounted to its intended package; and testing the die with signals designed to determine if it functions properly by passing test signals through said probe interconnections and through said probes.

6. An apparatus, comprising:

a first layer having a top surface having a first level and a second level, said second level defining a chip receptacle area;

a plurality of conductive chip interface terminals disposed on said second level within said chip receptacle area;

a board interface including an array of a plurality of conductive board interface terminals, said array located on a bottom surface, said bottom surface opposite from said top surface; and at least one interconnect layer disposed between said top surface and said bottom surface, said layers including electrical connections to said chip interface terminals and electrical connections to said board interface terminals, wherein at least one of said interconnect layers within said plurality of interconnect layers contains an active component.

7. The apparatus in claim 3, wherein said active component is comprised of a diode.

8. The apparatus in claim 3, wherein said active component is comprised of a transistor.

9. The apparatus in claim 3, wherein said active component is comprised of a voltage regulator.

10. A method for designing an assembly formed from an integrated circuit wafer die and a die package for encapsulating the die, the method comprising the steps of:

forming a plurality of interconnect layers and an electrical component to within the package;

using a CAD design tool to design the electrical layout of the assembly;

making the CAD design tool aware of the interconnect layers disposed within the die package;

making the CAD design tool aware of the electrical component disposed within the die package;

making the CAD design tool aware of a board interface having an array of a plurality of conductive board interface terminals, said array located on a second surface of the package, said second surface opposite from said first surface;

having the CAD design tool prepare a design for the assembly including: at least one electrical routing from the wafer die to the package interconnect and back to the wafer die, and at least one electrical routing from the wafer die to the electrical component and back to the wafer die; and having the CAD design tool prepare a design for the assembly having at least one electrical routing from one of the package interconnect layers to one of said conductive board interface terminals.

* * * * *

UNITED STATES PATENT AND TRADEMARK OFFICE
CERTIFICATE OF CORRECTION

PATENT NO. : 5,777,383
DATED : July 7, 1998
INVENTOR(S) : Mark P. Stager, Abraham F. Yee, Gobi R. Padmanabhan It is certified that error appears in the above-identified patent and that said Letters Patent is hereby corrected as shown below:

<u>TITLE PAGE</u>

In the "U.S. PATENT DOCUMENTS" section, replace "5,376,390" with
--5,371,390--.

In the "FOREIGN PATENT DOCUMENTS" section, replace "379404 A" with --
378404 A--.

In Col. 5, line 9, replace "pall" with --ball--.

In Col. 8, line 32, replace "3" with --6--.

In Col. 8, line 34, replace "3" with --6--.

In Col. 8, line 36, replace "3" with --6--.

Signed and Sealed this

Twenty-second Day of December, 1998

*Attest:*

BRUCE LEHMAN

*Attesting Officer*   Commissioner of Patents and Trademarks